United States Patent [19]

Szepesi et al.

[11] Patent Number: 5,229,707
[45] Date of Patent: Jul. 20, 1993

[54] APPARATUS AND METHOD FOR ELIMINATING FALSE CURRENT LIMIT TRIGGERING IN A GROUNDED SOURCE-EMITTER POWER SWITCHING CIRCUIT

[75] Inventors: Tamas S. Szepesi, San Jose; Harry J. Bittner, Santa Clara, both of Calif.

[73] Assignee: National Semiconductor Corporation, Santa Clara, Calif.

[21] Appl. No.: 956,832

[22] Filed: Oct. 5, 1992

Related U.S. Application Data

[63] Continuation of Ser. No. 699,775, May 14, 1991, abandoned.

[51] Int. Cl.[5] .................. G05F 1/569; H02H 7/12; H02M 3/156
[52] U.S. Cl. ............................ 323/222; 361/18; 363/56
[58] Field of Search ............. 323/222, 284, 285; 361/15, 93, 98; 363/56

[56] References Cited

U.S. PATENT DOCUMENTS

| | | | |
|---|---|---|---|
| 4,674,020 | 6/1987 | Hill | 323/222 |
| 4,750,079 | 6/1988 | Fay et al. | 361/98 |
| 4,837,495 | 6/1989 | Zansky | 323/222 |
| 4,937,697 | 6/1990 | Edwards et al. | 361/18 |
| 5,028,861 | 7/1991 | Pace et al. | 323/222 |
| 5,138,516 | 8/1992 | Chapman | 361/18 |

FOREIGN PATENT DOCUMENTS 3104015  8/1982  Fed. Rep. of Germany ........ 361/18

Primary Examiner—William H. Beha, Jr.
Attorney, Agent, or Firm—Limbach & Limbach

[57] ABSTRACT

A current sense/limit circuit senses a current of a power switch and turns off the switch when a peak current of the power switch surpasses a preprogrammed value. To prevent the circuit from reacting to a leading edge current spike resulting from the reverse recovery of a clamp or diode which is a part of most power processing circuits, the current sense/limit circuit monitors the voltage on the power switch and disables the current sense circuitry as long as this voltage does not drop below a predetermined threshold value. The predetermined threshold value is higher than the worst case voltage on the power switch during its on-time under normal operating conditions, and much lower than the switch voltage during off-time. As a result, this method adaptively blocks the current sense mechanism during most of the reverse recovery current spike period. The circuit also includes a timer that turns the switch off if the current sense/limit circuit remains disabled longer than a predetermined time to prevent switch damage resulting from a short circuit of the switch's drain-collector to the supply voltage.

13 Claims, 6 Drawing Sheets

APPARATUS AND METHOD FOR ELIMINATING FALSE CURRENT LIMIT TRIGGERING IN A GROUNDED SOURCE-EMITTER POWER SWITCHING CIRCUIT

This is a continuation of co-pending application Ser. No. 07/699,775 filed on May 14, 1991 by Tamas S. Szepesi, et al. now abandoned.

TECHNICAL FIELD

The present invention relates broadly to power switching circuitry and, more particularly, to a control circuit for eliminating false current limit triggering of a power switching device.

BACKGROUND OF THE INVENTION

Switching regulators are used to control the flow of power from an input voltage supply to a load.

In general, a switching regulator includes a minimum of two switching elements and energy storing/filtering components as well as control circuitry. The control circuitry turns the switches on and off to provide constant output voltage with variable input voltage and load conditions. The energy storing/filtering components usually comprise an inductor and a capacitor, but can also include a transformer. Of the two switching elements, in most cases, only one has to be controlled, the other can be a diode. (The only exception is when bidirectional energy transfer between the input and output is used).

During the controlled switch's on-time, energy is stored into the inductor, while the diode is reverse biased, separating the output from the input. When the switch is turned off by the control circuitry, the diode turns on, transferring all or part of the stored energy to the output. If only part of the energy is transferred ("continuous" operating mode), then the diode is still forward biased (conducting current) when the switch turns on. To turn off the diode, the stored charge in its junction has to be depleted. During this time period (reverse recovery time), the diode behaves like a short circuit and draws a large transient current spike from the input through the controlled switch. If, as in most cases, the control circuitry includes a subcircuit that limits or controls the peak switch current on a cycle by cycle basis, this transient current glitch can trigger the current limit circuitry causing the instantaneous turn-off of the power switch. This malfunction prevents the switching regulator from operating correctly and from transferring any significant amount of power from the input to the output.

In the past, two conventional approaches have been employed to protect the current limit comparator during the reverse recovery time of the diode. One approach uses a low pass filter (e.g., an RC filter) to filter out the current spikes. Alternatively, the current comparator may be disabled (blanked) for a fixed amount of time after it is turned on. With either approach, the circuit has to be strongly overdesigned to accommodate for the worst case scenario for a variety of different diodes.

It would therefore be desirable to have available a switching regulator wherein the current limit sense/comparator circuitry is disabled adaptively only during the diode's reverse recovery time.

SUMMARY OF THE INVENTION

The present invention provides a current limit circuit for a power switch that optimally disables the current limit comparator during the reverse recovery time of the diode, thereby eliminating false current limit triggering of the current sensing circuitry. Since the false current sensing circuit does not employ a low pass filter to filter out the current spikes, the circuit is less expensive to fabricate because it occupies less space on an integrated circuit die. Furthermore, the current limit circuit is advantageous over the conventional circuits since it may be used with any switching regulator, regardless of the type of diode employed.

The current sense circuit in accordance with the present invention incorporates means for sensing the power switch's current and for converting it to a proportional voltage as all conventional circuits do. This current-proportional voltage is compared to a voltage that programs the actual value of the current limit by the current limit comparator. If the current proportional voltage exceeds the value of the current limit programming voltage, then the current limit comparator turns off the power switch through the control/logic circuitry. In addition to the conventional system, the circuit of the present invention includes a switch voltage monitor circuit that monitors the voltage across the power switch. This monitor circuitry disables the current sense circuitry or the current sense comparator as long as the switch voltage does not drop below a preset threshold voltage. The threshold voltage is near but larger than the value of the switch voltage in its "ON" state, and much lower than its voltage in the "OFF" state. Because the switch voltage stays high, near its "OFF" state value, during most of the diodes recovery time, this arrangement blocks the current sense mechanism during most of the current spick caused by the diode's recovery, thereby adaptively eliminating the false triggering due to this leading edge current spike.

The current sense circuitry of the present invention may also include a timer circuit that turns off the power switch if the switch voltage does not drop below the above-mentioned threshold voltage within the timers preselected time period, starting at the turn-on command from the control/logic circuitry. This feature protects the switch from destruction in a direct short circuit situation.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 1:
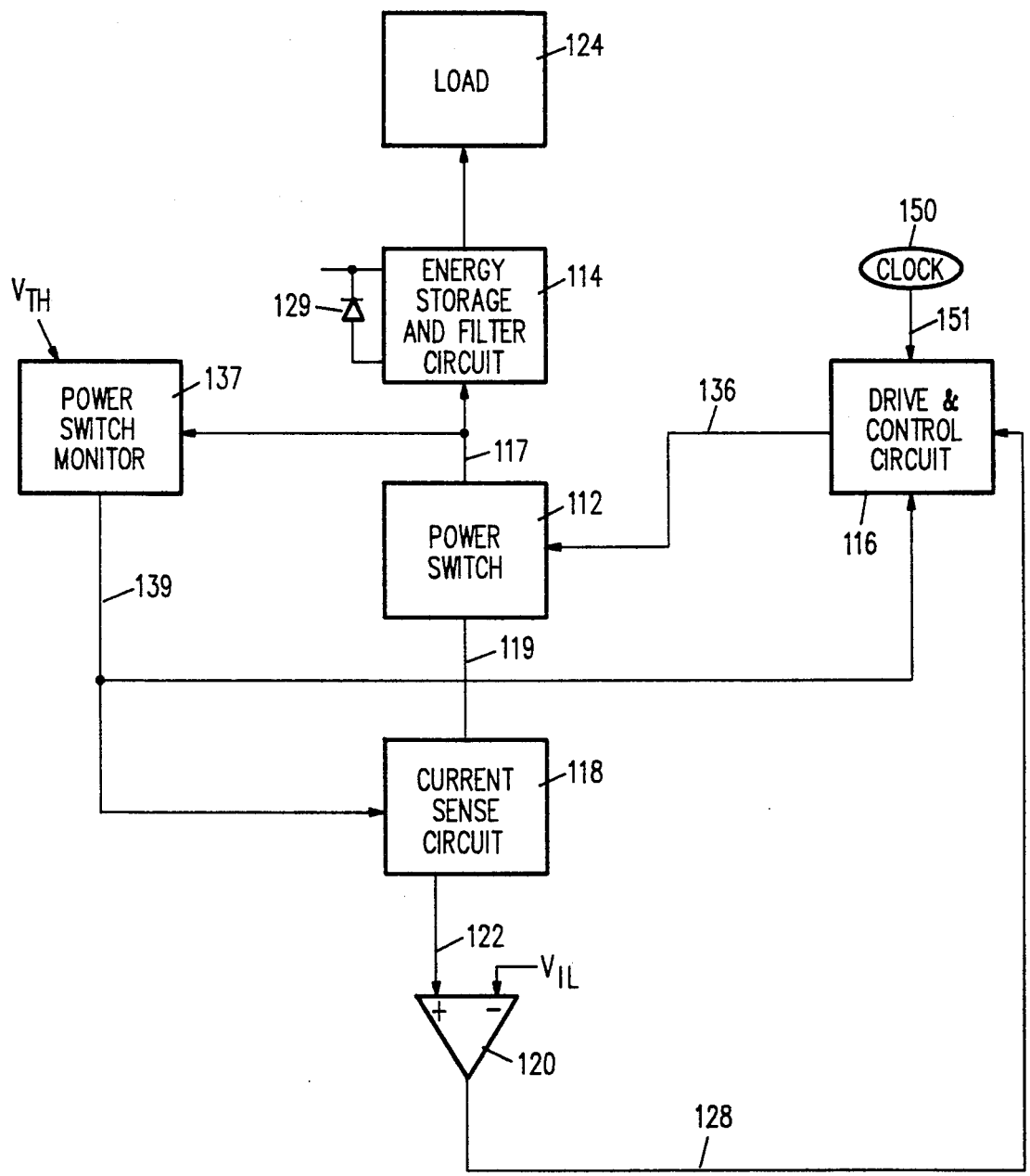
FIG. 1 is a general block diagram illustrating a current sensing/limiting circuit in accordance with the present invention.

FIG. 1 shows a switching regulator circuit 100 that utilizes current sensing/limiting circuit in accordance with the present invention.

The switching regulator circuit 100 includes a power switch 112 that supplies power pulses to a load 124 via an energy storage filter circuit 114. The power switch output signal 117 is also connected to switch voltage monitor circuitry 137 that monitors the voltage on the power switch 112. A signal 119, proportional with the current of switch 112, is provided to the current sense circuitry 118 that generates a voltage output 122 that is proportional to the current output of the power switch 112.

The current sense output signal 122 is provided to the non-inverting input of a current limit comparator 120. The current limit comparator 120 also receives a variable reference voltage $V_{IL}$ at its inverting input. The variable reference voltage $V_{IL}$ may be selected to be a current limit set voltage (i.e., the voltage at which current limiting is desired). It can also be controlled in a closed loop to maintain the desired output voltage on the load 124 in current-mode controlled switching applications.

The current limit comparator 120 compares the current sense output signal 122 and the variable reference voltage $V_{IL}$ and generates a comparison signal 128 which controls power switch 112. That is, if the voltage of the current sense output signal 122 exceeds the current limit set voltage $V_{IL}$, then the power switch 112 is turned off through driver and control circuit 116.

Driver and control circuit 116 generates a power control signal 136 that turns on the power switch 112 when a clock signal 151 provided by clock 150 is asserted and turns off the power switch 112 in response to the comparison signal 128.

The switching regulator circuit 100 further includes a power switch monitor circuit 137 for monitoring the output signal 117 of the power switch 112. The power switch monitor circuit 137 has a dual function. First, during normal operation, it prevents the current sense circuitry 118 from reacting to the switch current signal before the switch voltage has dropped below a preset limit ($V_{TH}$), thereby eliminating the early turn-off of the power switch 112 during the current peak caused by the recovered charge of diode 129. Second, it protects the power switch 112 during malfunction, e.g., short circuit to $V_{in}$. The power switch monitor circuit 137 turns off the power switch 112 by monitor output signal 139 via control circuit 116 if the switch voltage does not fall below the $V_{TH}$ limit within a predetermined time. Hence, the power switch monitor circuit 137 saves the power switch 112 from overdissipation (i.e., from catastrophic failure).

Figure 2:
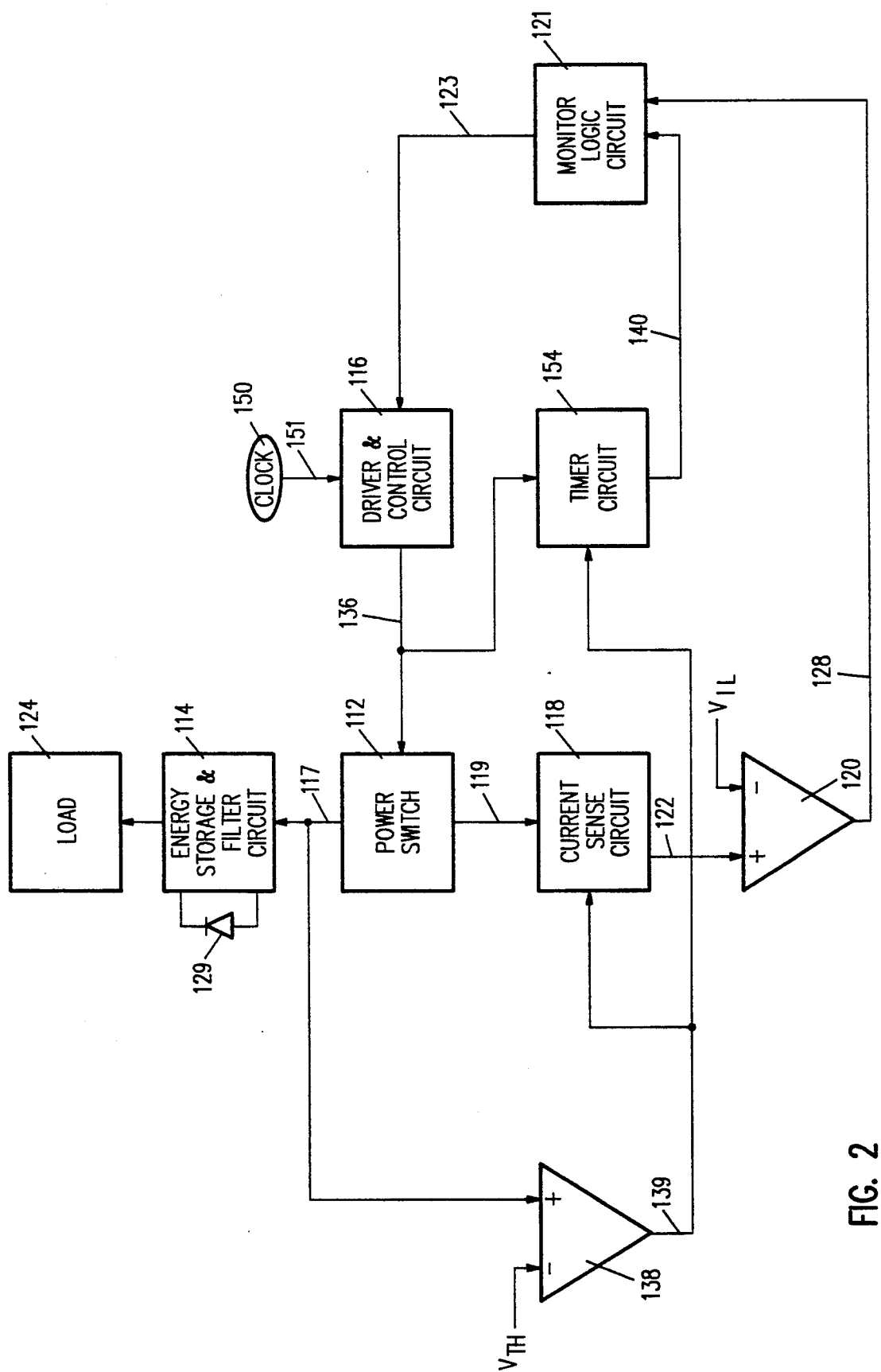
FIG. 2 is a more detailed block diagram illustrating a current sensing/limiting circuit in accordance with the present invention.

FIG. 2 shows an alternate embodiment 200 of a current limit sense circuit in accordance with the present invention. Throughout this detailed description, similar elements are identified using the same reference characters.

The alternate circuit 200 shows a more detailed block diagram of a preferred embodiment of a power switch monitor circuit 137.

As shown in FIG. 2, the power switch monitor circuit 137 includes an output comparator 138. The switching regulator 100 further including a timer circuit 154 and a monitor logic circuit 121. The output comparator 138 receives the power switch output signal 117 at its non-inverting input and a threshold voltage signal $V_{TH}$ at its inverting input and generates the monitor output signal 139 when the power switch output signal 117 reaches the threshold voltage $V_{TH}$.

The monitor output signal 139 is provided to the current sense circuit 118 to disable it during the time that the power switch output voltage 117 is higher than threshold voltage signal $V_{TH}$.

The monitor output signal 139 is also provided to timer circuit 154. The timer circuit 154 initiates a timing cycle at the instant when the power switch 112 is turned on by the power switch control signal 136. If the output signal 139 of the switch voltage monitor 138 goes low, signifying that the power switch voltage has dropped below $V_{IL}$ (e.g., the power switch 112 has turned on correctly) before the timing period has been completed, it resets the timer 154. If, however, signal 139 does not go low within the preset timing period, then timer 154 turns off the power switch 112 via its output signal 140 through monitor logic circuit 121 and control circuit 116. Thus, the timer 154 is an additional safeguard to turn the switch off if a short circuit to $V_{IL}$ occurs.

As shown in FIG. 2, the timing signal 140 from timer 154 is provided to the monitor logic circuit 121 along with the comparison signal 128. If either the comparison signal 128 or the timing signal 140 is asserted, then the monitor logic circuit 121 provides a shutdown signal 123 to control circuit 116 to instruct the control circuit 116 to turn off the power switch 112 via power switch control signal 136.

Figure 3:
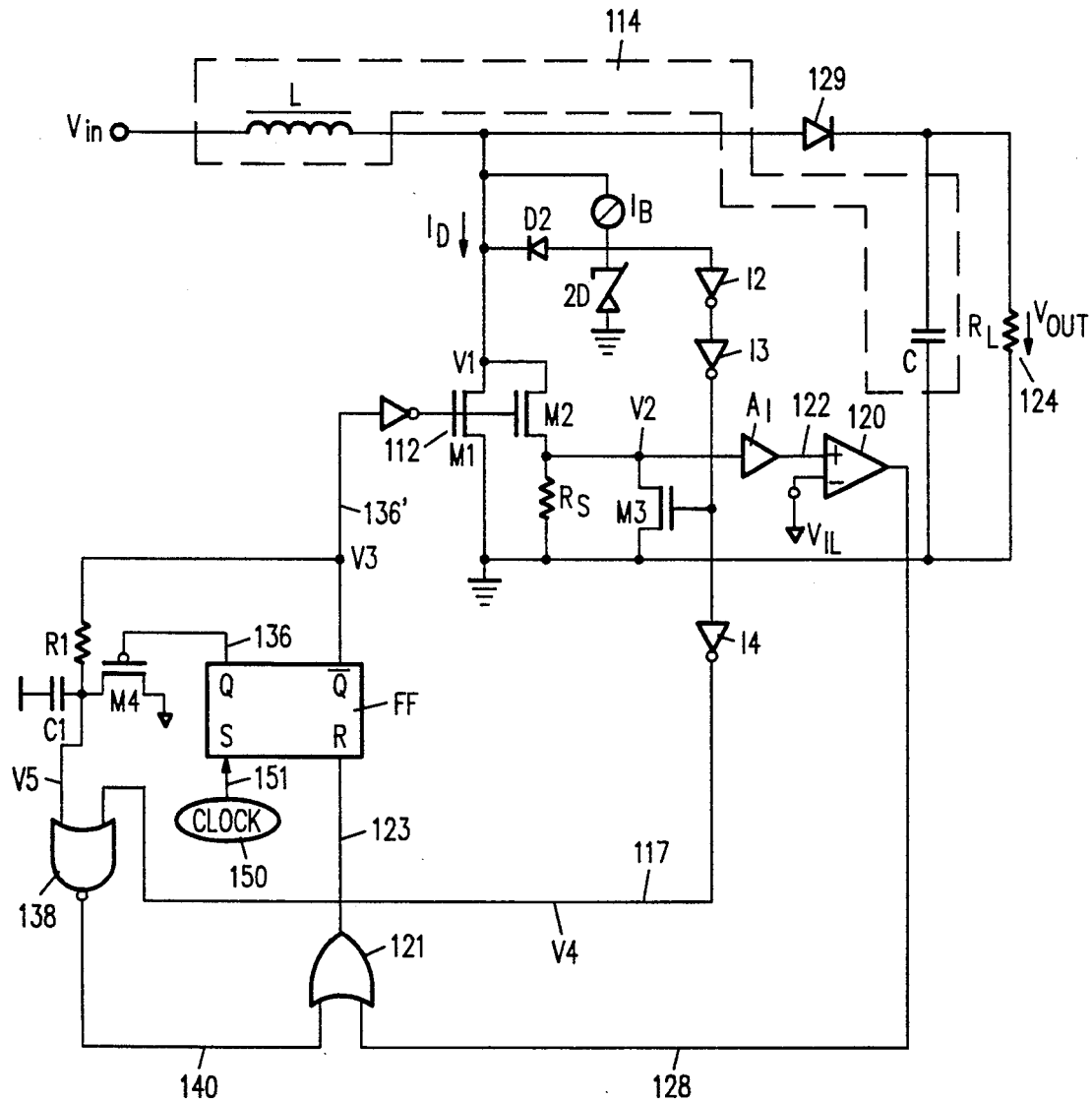
FIG. 3 is a schematic diagram illustrating a circuit that corresponds to the FIG. 2 block diagram.
Figure 4:
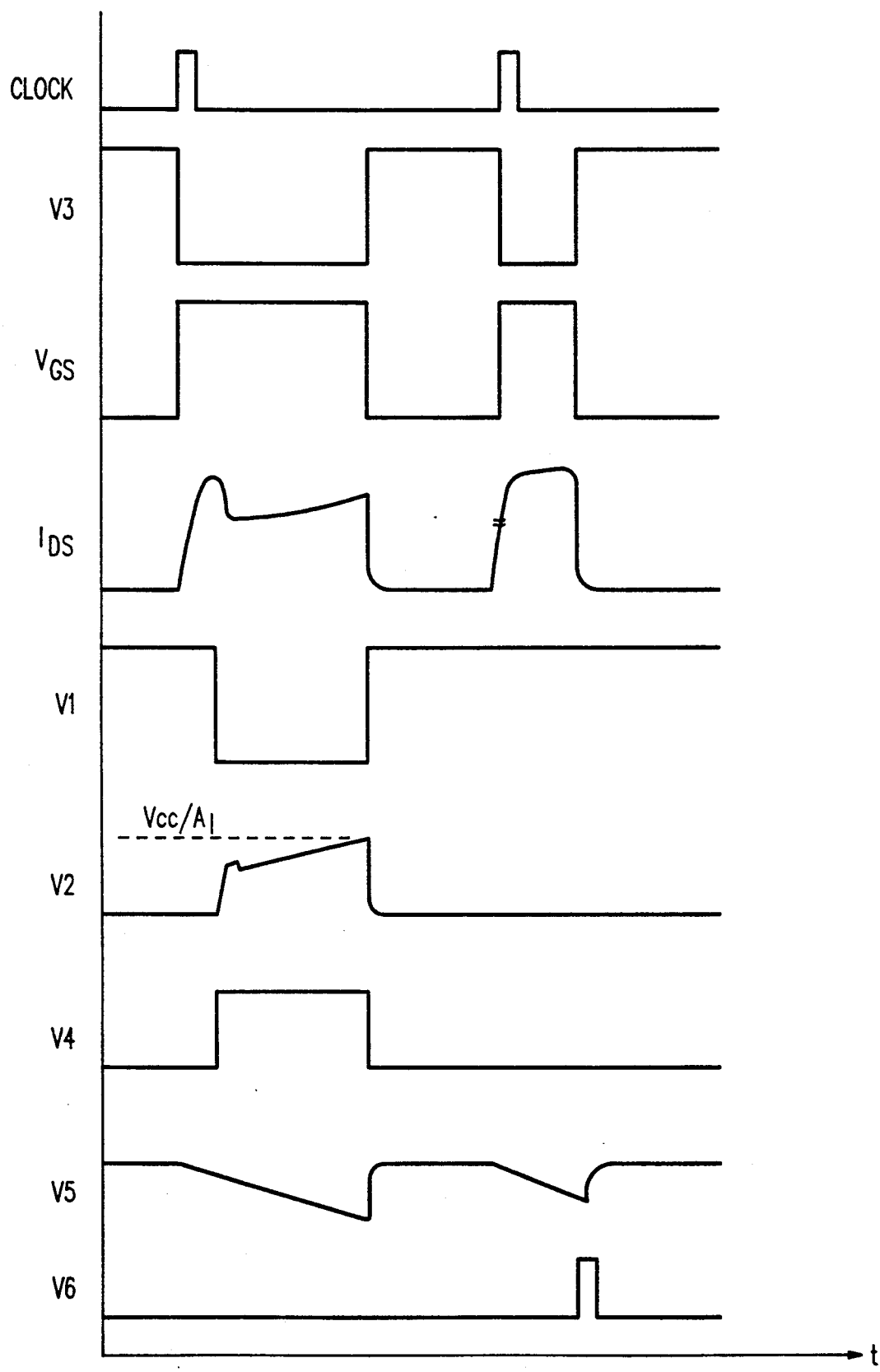
FIG. 4 is a timing diagram illustrating operational waveforms of signals in the FIG. 3 circuit.

Referring now to FIGS. 3 and 4, FIG. 3 shows a circuit diagram corresponding to the current limit/sense circuits shown in FIGS. 1 and 2. FIG. 4 is a timing diagram corresponding to the circuit diagram of FIG. 3 and showing two on-off cycles of power switch 112.

As illustrated in FIG. 3, load 124 is connected to M1 power switch 112 through an energy storing/filtering circuit 114 that includes an inductor L, a capacitor C and diode 129.

The current sense circuit 118 includes a current sense resistor $R_S$ and a sense switch transistor M2. The sense switch transistor M2 is connected in series with the sense resistor $R_S$. The illustrated current sense circuit 118 also includes an amplifier $A_I$ and FET M3.

The M1 power switch 112 has its drain connected to the inductor L and to diode 129, its gate connected to control circuit 116 and its source connected to ground. The current sense resistor $R_S$ is connected between ground and the source of the sense switch transistor M2.

The sense switch transistor M2 has substantially identical characteristics as the M1 power switch 112. However, it has a much smaller area than the power switch M1. Hence, the current through the sense switch transistor M2 is proportional to but much lower than the current through the M1 power switch 112.

The drain of the sense switch transistor M2 is connected to the drain of the M1 power switch 112; the gate of the sense switch transistor M2 is connected to the gate of the M1 power switch 112; the source of sense switch transistor M2 is connected to the sense resister $R_s$ and the non-inverting input of the current limit comparator 120 via current sense amplifier $A_I$.

Transistor M3 is employed to disable the current sense circuit. However, other methods may also be used to disable amplifier $A_I$ and/or the comparator during the high state of invertor I3's output.

During the recovery time of diode 129, the drain of M1 power switch 112 is high. Therefore, diode D2 is reverse biased and the input of invertor I2 is high defined by zener diode D2. This translates to a logic "high" level on the output of invertor I3 which turns NMOS FET M3 on, thereby shunting current away from the current sense resistor $R_s$. The on resistance $R_{DSON3}$ of transistor M3 is much less than the resistance of the current sense resistor $R_s$.

After most of the recovery time of diode 129 has elapsed, the drain voltage of the M1 power switch 112 rapidly decreases. If it falls below $V_{TH}-V_{D2}$ ($V_{TH}$ is the logic threshold voltage of invertor I2), then invertors I2 and I3 change state. When invertors I2 and I3 change state, transistor M3 turns off, thereby enabling the current sense signal on resistor $R_s$. If the voltage on resistor $R_s$ reaches $V_{CL}/A_I$, then the comparator 120 output changes polarity, resets the flip-flop FF and turns off the M1 power switch 112.

The driver and control circuit 116 includes a driver 115 and a flip flop FF. The flip flop FF has a shut down input terminal R and a clock input terminal S connected to the clock generator 150.

The shut down input terminal R is connected to receive the output of the current limit comparator 120 via the monitor logic circuit (i.e., OR gate) 121.

The power switch control signal 136 and its complement 136' are provided at the Q and $\bar{Q}$ outputs, respectively, of flip-flop FF. Flip-flop FF turns on the M1 power switch 112 at the rising edge of the clock signal 151 through driver 115.

As discussed above, the non-inverting input of current limit comparator 120 is connected to the current sense resistor $R_s$ through amplifier $A_I$ and receives the current limit sense signal 122. The inverting input of comparator 120 is connected to receive the current limit set voltage $V_{IL}$. The current limit comparator 120 compares the current limit sense signal 122 and the current limit set voltage $V_{IL}$ and generates a current limit comparison signal 128 indicative of the compared result. The current limit comparison signal 128 turns off the power switch 112, via the control circuit 117, when the current limit set voltage $V_{IL}$ has been reached.

If, for any reason, the drain of M1 power switch 12 is forced to a voltage higher than $V_{TH}-V_{D2}$ (e.g. to $V_{in}$), then the current limit circuit stays blocked via transistor M3 and the Mi power switch 112 is unprotected. To protect against this condition, timer circuit 154 initiates a timing cycle to monitor the length of time that the power switch voltage remains high. At the end of the time period, if the M1 power switch 112 voltage V is still higher than $V_{TH}+V_{D2}$, then the timer circuit 154 generates the timing signal 140 to turn off the power switch 112.

As shown in FIGS. 3 and 4, the timer circuit 154 includes an RC timer, comprising resistor R1 and capacitor C1 in series, and a charging p-channel FET M4. Transistor M4 minimizes the dead time of timer circuit 154 by rapidly charging up the capacitor C1 to $V_{SL}$ (logic supply) after the M1 power switch 112 has been turned off. The timer circuit 154 receives the power switch control signal 136 and its complement signal 136' from flip-flop FF. The control signal 136 initiates the discharge cycle of timer capacitor C1 via resistor R1. If the voltage V5 of capacitor C1 reaches the logic threshold of NOR gate 138 during the time voltage V4 is still low (i.e., $V_i$ is higher than $V_{TH}+V_D$), then the output 140 of NOR gate 138 goes high turning off the power switch 112 through OR gate 121 and flip-flop FF. NOR gate 138 disables the turn off action if voltage V1 drops below $V_{TH}+V_D$ before voltage V5 reaches $V_{TH}$.

Figure 5:
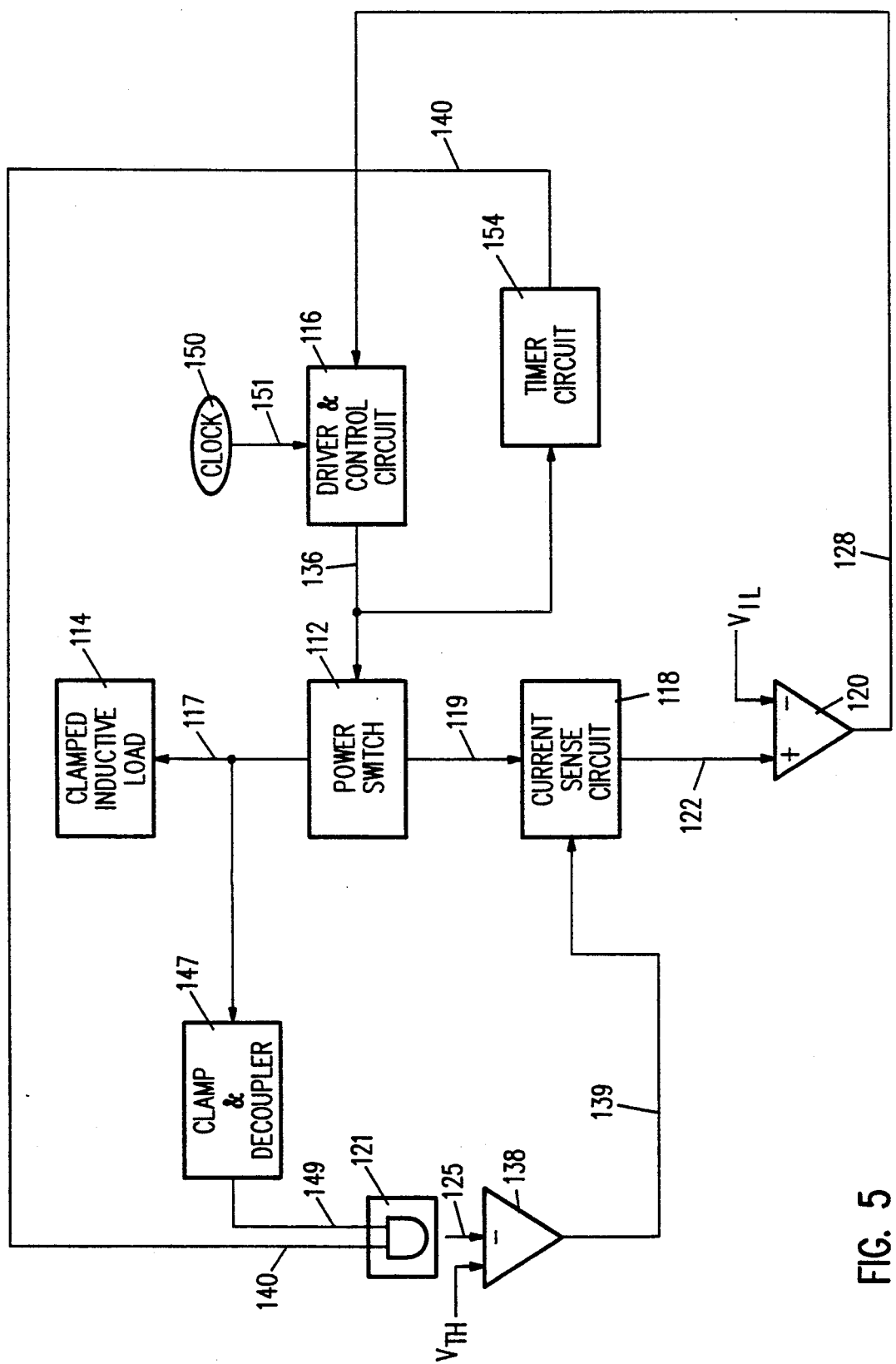
FIG. 5 is a block diagram illustrating an alternative embodiment of a current sensing/limiting circuit in accordance with the present invention.

FIG. 5 shows a block diagram, similar to the block diagram of FIG. 1, for an alternate embodiment 300 of a current limit/sensing circuit in accordance with the present invention.

The alternate circuit 300 employs an alternate power switch monitor circuit 137 and realizes the short circuit protection feature described above in an alternate manner.

The alternate power switch monitor circuit 137 enables and disables the current sense circuit 118 as described above for circuit 200. However, the timer output signal 156 does not turn off the power switch 112 directly through the control circuit 116. Rather, the timer output signal 156 disables the voltage monitor comparator 138, through monitor logic circuit 121, which enables the current sense circuit 118. This turns off the power switch 112 through the comparator 120 and control circuit 116, as described above.

The power switch monitor circuit 137 includes timer circuit 154, power switch voltage comparator 138 and monitor logic circuit 121. The power switch control signal 136 enables the power switch 112, it also turns on the timer circuit 154 to begin its preset time cycle. The timer circuit 154 provides the timer signal 140 as an input to monitor logic circuit 121 when the time cycle has expired.

The power switch output 117 is connected to a second input of the monitor logic circuit 121 through the clamp/decoupling circuit 147. The clamp/decoupling circuit 147 ensures that the voltage swing on the input of analog monitor logic circuit 121 is limited to a preselected voltage range. The monitor logic circuit 121 generates a monitored signal output 125 which follows the lower of its two inputs 140 and 149 and which is provided as the inverting input of power switch voltage comparator 138. The monitored signal 125 is compared with the threshold voltage $V_{TH}$ to determine whether the current sense circuit 118 can be enabled.

The monitor output signal 139 of comparator 138 is provided to the decoupling input of the current sense circuit 118 to enable/disable the current sense circuit 118. If the potential of the monitor output signal 125 is below the threshold voltage, then the monitor output signal 139 enables the current sense circuit 118. Otherwise, the monitor output signal 139 disables the current sense circuit 118 so that the current limit comparator 120 cannot turn off the power switch 112 through control circuit 116.

Figure 6:
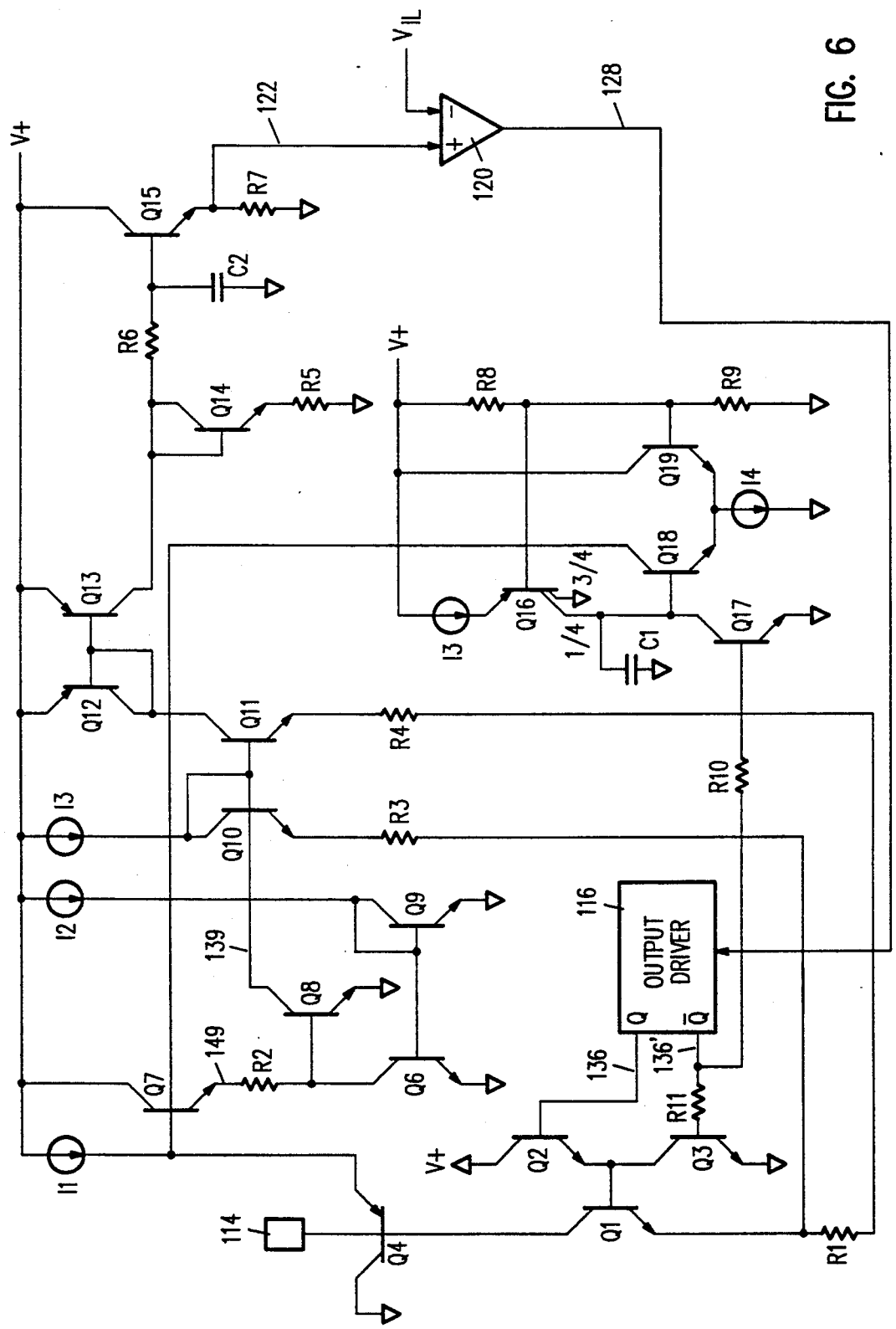
FIG. 6 is a schematic diagram illustrating a circuit that corresponds to the FIG. 5 block diagram.

FIG. 6 provides a schematic diagram, corresponding to the block diagram of FIG. 5, that shows the current limit/sensing circuit 300 used in a switching regulator output stage. The circuit 300 utilizes bipolar transistors, whereas the circuit 200 shown in FIG. 3 employs MOS transistors.

In the FIG. 6 embodiment, the power switch 112 is a bipolar transistor Q1 driven by driver and control circuit 116. The driver and control circuit 116 includes transistors Q2, and Q3, resistor R11 and an output driver 115. The emitter of transistor Q2 and the collector of transistor Q3 are tied to the base of transistor Q1. Complementary output signals Q and $\overline{Q}$ of output driver 115 are provided to the base terminals of transistors Q2 and Q3, respectively, to control transistors Q2 and Q3.

When $\overline{Q}$ is high, transistor Q3 turns on, thereby turning on power switch Q1. When power switch Q1 is turned on, the circuit blocks the current sense circuitry by pulling down collector 139 as long as the collector of transistor Q1 does not fall below the $V_{TH}=V_{BE}+I2 * R2$ threshold. It, thereby, eliminates the false current limit triggering due to the switching diode's reverse recovery charge at turn-on.

The current sense circuit 118 includes a transimpedance amplifier (resistors R1, R3, R4, R5, and R7, and transistors Q10, Q11, Q12, Q13, Q14 and Q15) and a low pass filter (resistor R6 and capacitor C2) that senses the power switch current; when the power switch Q1 voltage is high, then the transimpedance amplifier is disabled.

When the transimpedance amplifier is enabled, it senses the emitter current of the power switch Q1. The current output of power switch Q1 creates a voltage drop across resistor R1 that appears across resistor R4 to vary the current of transistor Q11 in proportion to the switch current.

The current through transistor Q11 biases transistors Q12 and Q13 to create a voltage across transistor Q14 and resistor R5. Transistor Q14 level shifts the voltage of the power switch output by a $V_{be}$ so that the DC voltage of resistors R5 and R7 are equal. The amplifier's current-to-voltage gain is equal to R1 multiplied by R5/R4.

The power switch voltage comparator 138 includes transistors Q8, Q6 and Q9. The power switch comparator 138 looks at the collector voltage of the power switch 112 to see if it has dropped below the threshold voltage. Transistor Q8 enables/disables the 118 current sense circuitry.

The clamping circuit includes transistors Q4 and Q7 and resistor R2. The emitter-base of transistor Q4 is reverse biased if power switch Q1 is off and its collector voltage is higher than V+. The base of transistor Q7 is at nearly V+ and, therefore, transistor Q8 turns on through resistor R2. The voltage of the power switch output is sensed and clamped by transistors Q4 and Q7 and resistor R2. The base-emitter voltage $V_{be}$ of both transistor Q4 and transistor Q7 cancel each other out so that transistor Q8 turns on when the voltage of the power switch output is greater than one $V_{be}$ plus the voltage across $R_2(I2 * R2 \simeq 1 V)$. The emitter-base of transistor Q4 is reverse biased in this case. The base of transistor Q7 is at V+ and, therefore, transistor Q8 turns on through resistor R2.

When transistor Q8 turns on, the bases of transistors Q10 and Q11 are pulled down so that there is substantially no current through transistors Q10 and Q11. Transistor Q8 disables the current sense circuit 118 by pulling down the base of transistors Q10 and Q11 to approximately 0.1 V.

The current sense circuit 118 is disabled when the base of transistor Q7 is high. The base of transistor Q7 is high under two conditions: when transistor Q4 is off (i.e., when the Q4 base—emitter is reverse biased) or, as will be explained in greater detail below, when the output timer circuit output signal is high. The current sense circuitry is enabled after transistor Q1 turns on when its collector voltage drops and transistor Q4 turns on, pulling down the base of power switch Q7. This turns transistor Q8 off, enabling the transistor Q10-Q11 mirror and, thereby, the current sense circuitry 118.

The low pass filter (resistor R6 and capacitor C2) attenuates the high frequency voltage spikes in the current sense signal 122. The filter has a relatively high cut-off frequency of about 800 kHz since most of the turn-on noise is eliminated by disabling the current sense circuit 118. The current source I2 has a temperature coefficient opposite that of resistor R2. Current source I2 supplies current to transistor Q9 so that the threshold voltage of the transistor Q8 varies by about $+/-200$ mV over temperature.

To protect the power switch Q1 when it is shorted to the positive supply voltage V+, timer circuit 154 sets a maximum amount of time that the transimpedance amplifier may be disabled after the power switch Q1 is turned on.

The timer circuit 154 is realized by transistors Q16, Q17, Q18, and Q19; resistors R8 and R9; current sources I3 and I4; and capacitor C1. Transistors Q18 and Q19 have common emitters which are tied to current source I4. Current source I3 supplies current to the emitter terminal of transistor Q16. Since current source I3 and the positive supply voltage V+ have a low temperature coefficient, the delay time remains relatively constant over temperature. The timer circuit 154 has a preset timing cycle which elapses when the base voltages of transistors Q18 and Q19 are about equal. After the timing period has elapsed, the current sense circuit 118 is enabled if it has not previously been enabled by transistor Q4 prior to end of the timing period.

The collector of transistor Q18 is coupled to the base of the clamp circuit transistor Q7. The base of transistor Q18 is tied to the collector of transistor Q17, one of the collectors of transistor Q16 and to capacitor C1. The base of transistor Q17 is coupled to the output driver output $\overline{Q}$. The collector of transistor Q19 is coupled to the positive supply voltage V+; its base is tied to resistors R8 and R8. When the power switch Q1 is turned off, signal $\overline{Q}$ is high, transistor Q17 turns on and discharges capacitor C1 to approximately 0.1 V. When the power switch Q1 is turned on, the timer circuit 154 also turns on. Transistor Q17 turns off and capacitor C1 is charged by the I3 current source. Transistor Q18 turns on when the voltage across C1 is greater than the voltage across resistor R9. The base of transistor Q7 is pulled low and the transimpedance amplifier is enabled.

Under normal operation (before transistor Q18 is turned on), transistor Q4 pulls down the base of transistor Q7 after the reverse recovery time of the diode D1. When the base of transistor Q7 is pulled down, transistor Q8 turns off thus enabling the current sense circuit 118. Transistor Q16 clamps the maximum voltage across C1 to keep the collector voltage of transistor Q18 low enough to turn off transistor Q8.

Having thus described the invention, it is recognized that those skilled in the art may make various modifications or additions to the embodiments chosen to illustrate the invention without departing from the spirit and scope of the present contribution to the art. Accordingly, it is to be understood that the protection sought and to be afforded hereby should be deemed to extend to the subject matter claimed and all equivalents thereof within the scope of the invention.

What is claimed is:

1. A regulator circuit for disabling a power switch current limiter when a turn on instantaneous transient current spike is present, the turn-on instantaneous transient current spike occurring when the power switch is turned on, the regulator circuit comprising:

current sense means for sensing the power switch current and for generating a first voltage in response thereto unless a blanking signal is received, the first voltage being proportional to the power switch current; and first comparator means for comparing the first voltage with a current limit programming voltage and for generating the comparator signal when the first voltage is equal to or greater than the current limit programming voltage;

clock means for periodically generating a clock pulse signal;

control means for receiving the comparator signal and the clock pulse signal, for generating a turn off signal in response to the comparator signal, for generating a turn on signal in response to a clock pulse signal, the turn off signal turning off the power switch, the turn on signal turning on the power switch;

second monitor means for sensing a voltage across the power switch and for generating the blanking signal when the voltage across the power switch exceeds a threshold voltage.

2. The regulator circuit of claim 1 wherein the control means further comprises timing means for receiving the blanking signal, for timing a duration of the blanking signal, and for generating the turn off signal when the duration of the blanking signal exceeds a predetermined time.

3. A regulator circuit for disabling a power switch current limiter when a turn on instantaneous transient current spike is present, the turn-on instantaneous transient current spike occurring when the power switch is turned on, the regulator circuit comprising:

current sense means for sensing the power switch current and for generating a first voltage in response thereto, the first voltage being proportional to the power switch current; and first comparator means for comparing the first voltage with a current limit programming voltage unless a blanking signal is received and for generating the comparator signal when the first voltage is equal to or greater than the current limit programming voltage;

clock means for periodically generating a clock pulse signal;

control means for receiving the comparator signal and the clock pulse signal, for generating a turn off signal in response to the comparator signal, for generating a turn on signal in response to a clock pulse signal, the turn off signal turning off the power switch, the turn on signal turning on the power switch;

second monitor means for sensing a voltage across the power switch and for generating the blanking signal when the voltage across the power switch exceeds a threshold voltage.

4. The regulator circuit of claim 3 wherein the control means further comprises timing means for receiving the blanking signal, for timing a duration of the blanking signal, and for generating the turn off signal when the duration of the blanking signal exceeds a predetermined time.

5. The regulator circuit of claim 1 wherein the control means generates the shut down signal in response to a time out signal and further comprising timing means for receiving the blanking signal and the turn on signal, for timing a duration of the blanking signal in response to the turn on signal, and for generating the time out signal when the duration of the blanking signal exceeds a predetermined time.

6. The regulator circuit of claim 3 wherein the control means generates the shut down signal in response to a time out signal and further comprising timing means for receiving the blanking signal and the turn on signal, for timing a duration of the blanking signal in response to the turn on signal, and for generating the time out signal when the duration of the blanking signal exceeds a predetermined time.

7. The regulator circuit of claim 5 wherein the second monitor means further comprises:

voltage sense means for sensing the voltage of the power switch and for generating a second voltage in response thereto, the second voltage being proportional to the voltage of the power switch; and second comparator means for comparing the second voltage with a voltage limit programming voltage and for generating the blanking signal when the second voltage exceeds the voltage limit programming voltage.

8. The regulator circuit of claim 6 wherein the second monitor means further comprises:

voltage sense means for sensing the voltage of the power switch and for generating a second voltage in response thereto, the second voltage being proportional to the voltage of the power switch; and second comparator means for comparing the second voltage with a voltage limit programming voltage and for generating the blanking signal when the second voltage exceeds the voltage limit programming voltage.

9. The regulator circuit of claim 7 wherein the control means further comprises monitor logic circuit means for receiving the time out signal and the comparator signal and for generating the turn off signal when either the timing signal or the comparator signal is asserted.

10. A regulator circuit for disabling a power switch current limiter when a turn on instantaneous transient current spike is present, the turn-on instantaneous transient current spike occurring when the power switch is turned on, the regulator circuit comprising:

current sense means for sensing the power switch current and for generating a first voltage in response thereto unless a blanking signal is received, the first voltage being proportional to the power switch current; and first comparator means for comparing the first voltage with a current limit programming voltage and for generating the comparator signal when the first voltage is equal to or greater than the current limit programming voltage;

clock means for periodically generating a clock pulse signal;

control means for receiving the comparator signal, for generating a turn off signal in response to the comparator signal, for receiving the clock pulse signal, and for generating a turn on signal in response to the clock pulse signal, the turn off signal turning off the power switch, the turn on signal turning on the power switch;

timing means for receiving the turn on signal and for generating a timing signal a predetermined time after receiving the turn on signal; and second monitor means for receiving the timing signal, for sensing a voltage across the power switch, and for generating the blanking signal when the voltage across the power switch exceeds a threshold voltage unless the timing signal is asserted.

11. The regulator circuit of claim 10 wherein the second monitor means further comprises:
voltage sense means for sensing the voltage of the power switch and for generating a second voltage in response thereto, the second voltage being proportional to the voltage of the power switch;
logic means for receiving the timing signal and the second voltage and for transmitting the second voltage until the timing signal is asserted the predetermined time later; and
second comparator means for comparing the second voltage with a voltage limit programming voltage and for generating the blanking signal when the second voltage exceeds the voltage limit programming voltage.

12. A regulator circuit for disabling a power switch current limiter when a turn on instantaneous transient current spike is present, the turn-on instantaneous transient current spike occurring when the power switch is turned on, the regulator circuit comprising:
current sense means for sensing the power switch current and for generating a first voltage in response thereto unless a blanking signal is received, the first voltage being proportional to the power switch current; and
first comparator means for comparing the first voltage with a current limit programming voltage and for generating the comparator signal when the first voltage is equal to or greater than the current limit programming voltage;
clock means for periodically generating a clock pulse signal;
control means for receiving the comparator signal, for generating a turn off signal in response to the comparator signal, for receiving the clock pulse signal, and for generating a turn on signal in response to the clock pulse signal, the turn off signal turning off the power switch, the turn on signal turning on the power switch;
timing means for receiving the turn on signal and for generating a timing signal a predetermined time after receiving the turn on signal; and
second monitor means for receiving the timing signal, for sensing a voltage across the power switch, and for generating the blanking signal when the voltage across the power switch exceeds a threshold voltage unless the timing signal is asserted.

13. The regulator circuit of claim 12 wherein the second monitor means further comprises:
voltage sense means for sensing the voltage of the power switch and for generating a second voltage in response thereto, the second voltage being proportional to the voltage of the power switch;
logic means for receiving the timing signal and the second voltage and for transmitting the second voltage until the timing signal is asserted the predetermined time later; and
second comparator means for comparing the second voltage with a voltage limit programming voltage and for generating the blanking signal when the second voltage exceeds the voltage limit programming voltage.

* * * * *